United States Patent
Odagiri

(10) Patent No.: US 10,932,357 B2
(45) Date of Patent: Feb. 23, 2021

(54) ELECTRONIC APPARATUS

(71) Applicant: Sony Interactive Entertainment Inc., Tokyo (JP)

(72) Inventor: Kazuya Odagiri, Kanagawa (JP)

(73) Assignee: Sony Interactive Entertainment Inc., Tokyo (JP)

( * ) Notice: Subject to any disclaimer, the term of this patent is extended or adjusted under 35 U.S.C. 154(b) by 0 days.

(21) Appl. No.: 16/473,052

(22) PCT Filed: Dec. 26, 2017

(86) PCT No.: PCT/JP2017/046547
§ 371 (c)(1),
(2) Date: Jun. 24, 2019

(87) PCT Pub. No.: WO2018/128120
PCT Pub. Date: Jul. 12, 2018

(65) Prior Publication Data
US 2020/0092984 A1   Mar. 19, 2020

(30) Foreign Application Priority Data

Jan. 6, 2017   (JP) .............................. JP2017-000993

(51) Int. Cl.
*H05K 1/02* (2006.01)
*H05K 1/18* (2006.01)

(52) U.S. Cl.
CPC ............. *H05K 1/0216* (2013.01); *H05K 1/18* (2013.01); *H05K 2201/09063* (2013.01); *H05K 2201/10189* (2013.01)

(58) Field of Classification Search
CPC .................. H05K 1/18; H05K 1/0216; H05K 2201/09063; H05K 2201/10189; H01R 12/51; H01R 12/724; H01R 43/205
USPC ....................................................... 439/55, 79
See application file for complete search history.

(56) References Cited

U.S. PATENT DOCUMENTS

| | | | | |
|---|---|---|---|---|
| 5,576,935 | A * | 11/1996 | Freer ........................ | G06F 1/184 |
| | | | | 211/41.17 |
| 6,341,988 | B1 * | 1/2002 | Zhu ....................... | H01R 12/721 |
| | | | | 439/630 |
| 6,692,273 | B1 * | 2/2004 | Korsunsky ......... | H01R 13/6591 |
| | | | | 439/108 |

(Continued)

FOREIGN PATENT DOCUMENTS

| | | |
|---|---|---|
| EP | 3226665 A1 | 10/2017 |
| JP | 685408 A | 3/1994 |

(Continued)

OTHER PUBLICATIONS

Notification of Reasons for Refusal for corresponding JP Application No. 2018-560373, 8 pages, dated Oct. 8, 2019.

(Continued)

*Primary Examiner* — Hien D Vu
(74) *Attorney, Agent, or Firm* — Matthew B. Dernier, Esq.

(57) ABSTRACT

Disclosed is an electronic apparatus including a substrate (20) and a connector (10) disposed on one edge constituting an outer periphery of the substrate (20). A slit (21) is formed in the substrate (20), with a starting point being a position between an end point on one side of the edge and the position where the connector (10) is disposed.

8 Claims, 3 Drawing Sheets

(56) References Cited

U.S. PATENT DOCUMENTS

| | | | |
|---|---|---|---|
| 8,585,441 B2* | 11/2013 | Hsu | H01R 12/725 |
| | | | 439/569 |
| 9,298,227 B2* | 3/2016 | Lee | G06F 1/185 |
| 2008/0278384 A1 | 11/2008 | Shimasaki | |
| 2010/0045552 A1 | 2/2010 | Ueki | |

FOREIGN PATENT DOCUMENTS

| | | | |
|---|---|---|---|
| JP | 19950743554 A | 2/1995 | |
| JP | 7302956 A | 11/1995 | |
| JP | 19981056245 A | 2/1998 | |
| JP | 2001320137 A | 11/2001 | |
| JP | 2003234547 A | 8/2003 | |
| WO | 2016017024 A1 | 2/2016 | |

OTHER PUBLICATIONS

International Preliminary Report on Patentability and Written Opinion for corresponding PCT Application No. PCT/JP2017/046547, 10 pages, dated Apr. 10, 2018.

Extended European Search Report for corresponding EP Application No. 17889818.5, 8 pages, dated Jul. 15, 2020.

International Search Report for corresponding PCT Application No. PC/JP2017/046547, 2 pages, dated Apr. 10, 2018.

* cited by examiner

# ELECTRONIC APPARATUS

TECHNICAL FIELD

The present invention relates to an electronic apparatus including a connector for cable communication.

BACKGROUND ART

For wired communication connection between electronic apparatuses, various communication interfaces are utilized. Among them are those for transmitting and receiving signals at a comparatively fast clock in order to realize high-speed communication, such as, for example, universal serial bus (USB) 3.0 and high-definition multimedia interface (HDMI) (registered trademark).

SUMMARY

Technical Problem

A connector used in the aforementioned communication interface may generate a radiation current on a substrate to which the connector is mounted. Such a radiation current may cause a noise radiated from the substrate, thereby adversely affecting other circuit elements and the like mounted on the substrate.

The present invention has been made in consideration of the above-mentioned circumstances. Accordingly, one of the objects of the present invention is to provide an electronic apparatus by which radiation currents generated from a connector for performing wired communication can be restrained.

Solution to Problem

An electronic apparatus according to the present invention includes a substrate, and a connector disposed on one edge constituting an outer periphery of the substrate, in which a slit is formed in the substrate, with a starting point of the slit being a position between an end point on one side of the edge and a position where the connector is disposed.

DESCRIPTION OF EMBODIMENTS

Embodiments of the present invention will be described in detail below with reference to the drawings.

First Embodiment

Figure 1:
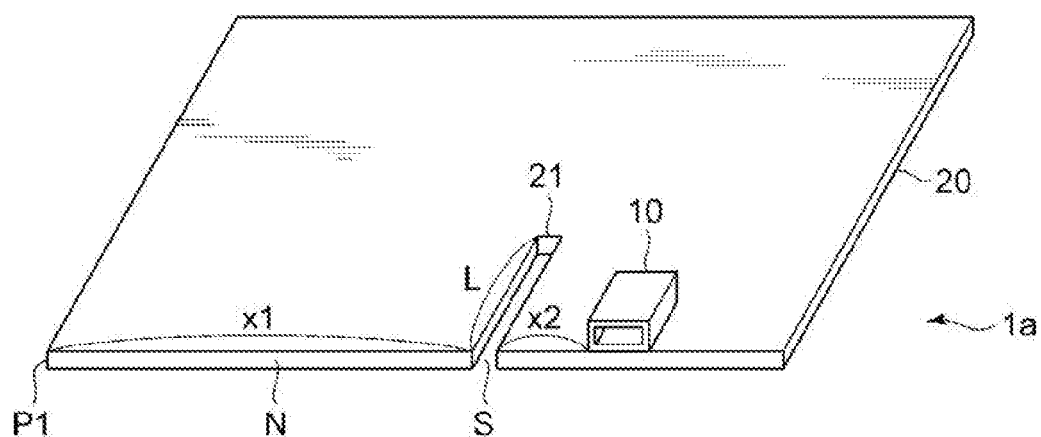
FIG. 1 is a view illustrating an example of appearance of a substrate included in an electronic apparatus according to a first embodiment of the present invention.

An electronic apparatus 1a according to a first embodiment of the present invention is, for example, a personal computer, a stationary type game machine, a portable type game machine, a smartphone, or the like, and includes a connector 10 for wired communication connection with other electronic apparatuses, and a substrate 20. FIG. 1 illustrates an example of appearance of the substrate 20 incorporated in the electronic apparatus 1a.

The substrate 20 is an electronic circuit substrate on which various circuit elements for realizing functions of the electronic apparatus 1a are mounted. In the present embodiment, as depicted in FIG. 1, the substrate 20 is in the shape of a flat plate which is rectangular in plan view. The connector 10 is fixed while being directed to one of four edges constituting the outer periphery of the substrate 20. In the following description, the one edge on the side where the connector 10 is disposed, of the edges constituting the outer periphery of the substrate 20, will be referred to as an edge N. Here, the connector 10 is one used for wired communication based on the USB 3.0 standard, and is a receptacle for connecting other USB apparatus through a USB cable or the like. When other USB apparatus is connected to the connector 10 and communication based on the USB 3.0 standard is performed between the electronic apparatus 1a and the USB apparatus connected thereto, a radiation current is generated on the substrate 20 under the influence of the communication. The radiation current is propagated in the substrate 20, mainly along the outer periphery of the substrate 20.

In order to restrain the radiation current, the substrate 20 is formed with a slit 21 in the vicinity of the connector 10. The slit 21 is a cutout which extends from one point (hereinafter referred to as a starting point S) on the outer periphery of the substrate 20 toward an inside of the substrate 20, and which penetrates the substrate 20 from the face side to the back side of the substrate 20. The starting point S is located on the edge N. In other words, the slit 21 is formed by cutting out the same side as the side where the connector 10 is disposed, of the substrate 20. In addition, the slit 21 is rectilinear in shape, and extends in a direction intersecting (here, a direction substantially orthogonal to) the edge N. The slit 21 restrains propagation of the radiation current generated on the substrate 20.

An electrical length of the slit 21 is preferably a length of $\frac{1}{8}\lambda$ to $\frac{3}{8}\lambda$, where $\lambda$ is a wavelength of the radiation current generated from the connector 10, and is more preferably a length close to $\frac{1}{4}\lambda$. With the electrical length of the slit 21 set to a value close to $\frac{1}{4}\lambda$, the radiation current of a wavelength of $\lambda$ can be effectively restrained. In a case where a relative dielectric constant of a surface of the substrate 20 is 1, the electrical length of the slit 21 coincides with its length L. However, in a case where the surface of the substrate 20 is a dielectric material having a high relative dielectric constant, the electrical length of the slit 21 becomes long relative to the length L. It is sufficient to determine the length L of the slit 21 such that the electrical length is a value close to $\frac{1}{4}\lambda$. Therefore, by use of a dielectric material having a high relative dielectric constant, the length L of the slit 21 necessary for limiting the radiation current of the same wavelength can be shortened.

Figure 2:
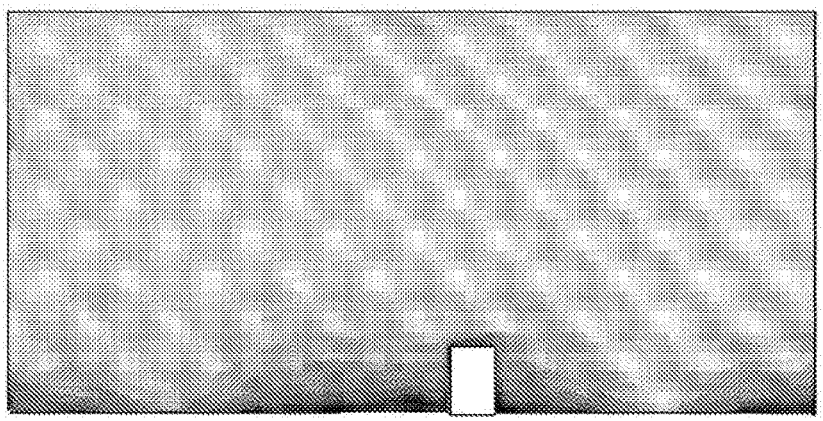
FIG. 2 is a diagram illustrating an example of distribution of radiation currents in a case where no slit is present.
Figure 3:
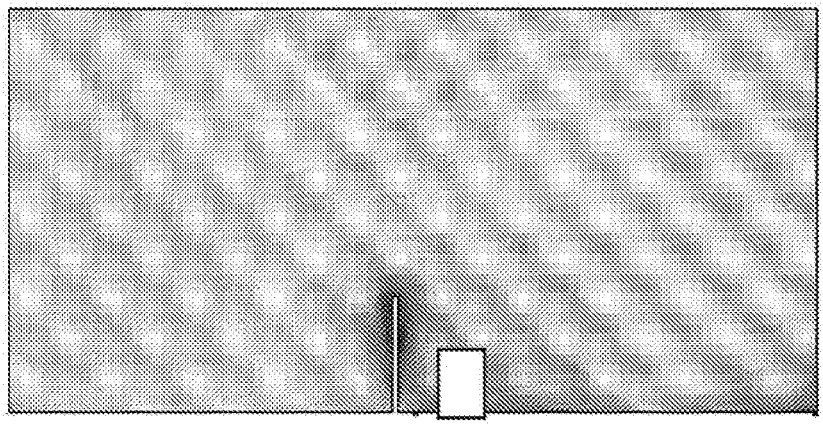
FIG. 3 is a diagram illustrating an example of distribution of radiation currents in a case where a slit is provided.

FIGS. 2 and 3 each illustrate a result of simulation of the distribution of the radiation currents generated from the connector 10 disposed on the substrate 20. In these diagrams, an area of higher concentration (heavier shading) represents a site where a strong radiation current is generated. FIG. 2 illustrates the distribution of the radiation currents in a case where no slit 21 is present, and FIG. 3 illustrates the distribution of the radiation currents in a case where the slit 21 is present. As illustrated in FIG. 2, in the case where no slit 21 is present, the radiation currents generated from the connector 10 are propagated mainly along the edge N where the connector 10 is disposed. On the other hand, in the case where the slit 21 is present, as depicted in FIG. 3, it is seen that although strong radiation currents are appearing in the surroundings of the slit 21, the radiation currents are not propagated beyond the slit 21, and the influence of the radiation currents is little in a region opposite to the connector 10 with the slit 21 interposed therebetween. Therefore, where a circuit element which is particularly desired not to be influenced by the radiation currents is disposed in a region on the right side of the slit 21, it is thereby possible to restrain the influence of the radiation currents. In other words, where the slit 21 is provided between the connector 10 and the circuit element desired to be protected from the radiation currents generated due to the communication through the connector 10, the circuit element can thereby be protected.

As has been described above, the starting point S of the slit 21 is located between the end point P1 on one side of the edge N and a position where the connector 10 is disposed. Further, the starting point S is preferably located at a position which is nearer to the position where the connector 10 is disposed than to the end point P1 of the edge N. Specifically, a distance from the slit 21 to the end point P1 on the edge N is set to x1, and a distance from the slit 21 to the position where the connector 10 is disposed is set to x2, then the position where the slit 21 is formed is determined in such a manner that x1>x2. As a result, the influence of the radiation currents generated from the connector 10 can be limited to within a narrow region, and a wider range on the substrate 20 can be protected from the radiation currents.

According to the electronic apparatus 1a according to the present embodiment, the propagation of the radiation currents generated on the substrate 20 due to high-speed communication through the connector 10 can be suppressed at the position of the slit 21, and the region opposite to the connector 10 with the slit 21 interposed therebetween can be protected from the radiation currents.

Second Embodiment

An electronic apparatus 1b according to a second embodiment of the present invention will be next described below with reference to FIG. 4. In the present embodiment, the shape of the slit 21 is different as compared to the first embodiment, but the other points are the same as those in the first embodiment. Therefore, the components corresponding to those in the first embodiment are denoted by the same reference signs as used above, and detailed descriptions of them will be omitted. This applies also to the other embodiments described hereinbelow.

Figure 4:
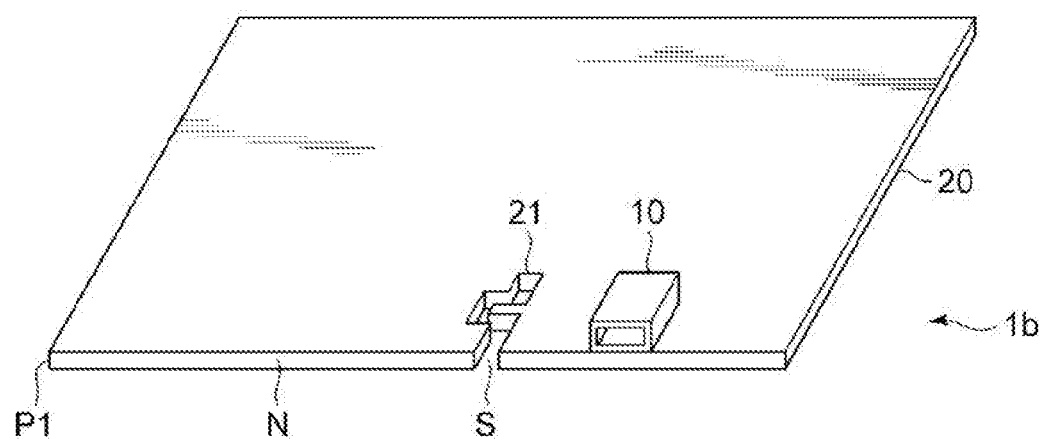
FIG. 4 is a view illustrating an example of appearance of a substrate included in an electronic apparatus according to a second embodiment of the present invention.

As illustrated in FIG. 4, in the present embodiment, the slit 21 is not rectilinear but is meandering in plan view. In other words, the slit 21 has a meandering shape. With such a shape, also, the propagation of radiation currents can be restrained by the slit 21. In this case, the total length of the slit 21 from the starting point S to the deepest portion is set to be coincident with the length L in the first embodiment. As a result of this, the slit 21 is able to restrain the radiation current of a wavelength which is approximately four times the electrical length of the slit 21.

According to the electronic apparatus 1b according to the present embodiment, the propagation of the radiation currents generated from the connector 10 can be restrained by the slit 21, like in the first embodiment. Further, with the slit 21 formed in the meandering shape, it is unnecessary to extend the slit 21 to the depth of the substrate 20, so that the degree of freedom in designing the circuit pattern is enhanced, as compared to the slit which is rectilinear in shape and has the same overall length as the meandering slit.

Third Embodiment

Figure 5:
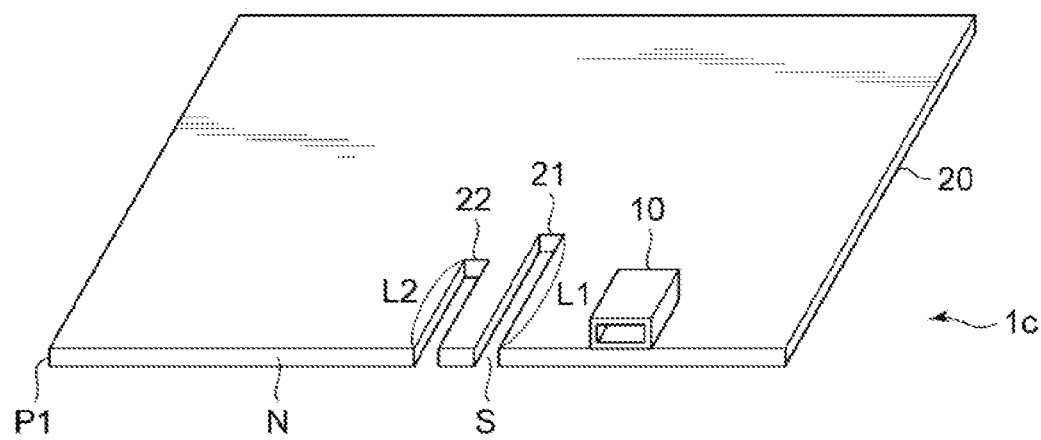
FIG. 5 is a view illustrating an example of appearance of a substrate included in an electronic apparatus according to a third embodiment of the present invention.

An electronic apparatus 1c according to a third embodiment of the present invention will be described below with reference to FIG. 5. The present embodiment is different from the above embodiments in that a plurality of slits are provided in the substrate 20. Specifically, in the present embodiment, two slits, namely, a slit 21 and a slit 22 are disposed side by side between the end point P1 and the connector 10.

The two slits are different from each other in length. In this case, the length of the slit 21 is set to L1, and the length of the slit 22 is set to L2. When the dielectric constant is set to 1, then, the radiation current of a wavelength of $\lambda1=4\cdot L1$ and the radiation current of a wavelength of $\lambda2=4\cdot L2$ can be restrained particularly effectively by these two slits. Thus, the plurality of slits differing in length are disposed side by side, so that, even in a case where the radiation currents generated from the connector 10 have a certain width of wavelengths or in a case where the radiation current has a plurality of wavelength peaks, such radiation currents can be limited.

Note that, while the two slits are disposed side by side herein, three or more slits differing from one another in length may be disposed side by side.

Fourth Embodiment

An electronic apparatus 1d according to a fourth embodiment of the present invention will be described below with reference to FIG. 6. The present embodiment is different from the above embodiments in that a plurality of connectors are disposed on the substrate 20 and that a slit is disposed not on only one side of the plurality of connectors, but the slits are disposed on both sides of the plurality of connectors.

Specifically, in the present embodiment, two connectors, namely, a connector 10 and a connector 11 are disposed side by side on the same side of the substrate 20. Besides, in addition to a slit 21 disposed between the connector 10 and the end point P1, another slit 23 is further disposed on the side opposite to the slit 21 with the connector 10 interposed therebetween. More specifically, the two slits, namely, the slit 21 and the slit 23 are disposed with the connector 10 and the connector 11 interposed therebetween on the edge N. The connector 11 may be a receptacle for transmitting a video signal to an external video display apparatus, based on the HDMI standard.

The slit 21 is disposed between the connector 10 and the end point P1 on the connector 10 side of the edge N, like in the above embodiments. On the other hand, the slit 23 is disposed between the connector 11 and an end point P2 on the connector 11 side of the edge N. Note that the length of the slit 23 may be the same as the length of the slit 21. As a result, on the edge N, the slits are disposed on both sides of the connector 10, and, simultaneously, the slits are disposed on both sides of the connector 11. Such a layout ensures that radiation currents generated from both the connector 10 and the connector 11 can be limited in such a manner that they are not propagated beyond the slit 21 and the slit 23 to the exterior.

Figure 6:
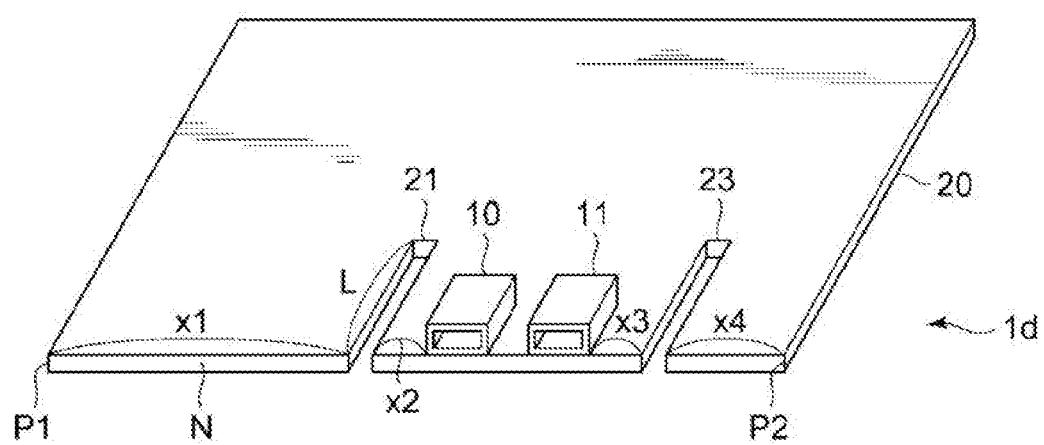
FIG. 6 is a view illustrating an example of appearance of a substrate included in an electronic apparatus according to a fourth embodiment of the present invention.

Note that in FIG. 6, with respect the distance x1 from the slit 21 to the end point P1 and the distance x2 from the slit 21 to the connector 10, the relation of x1>x2 is established, like in the first to third embodiments. Further, with respect to the distance x3 from the slit 23 to the connector 11 and the distance x4 from the slit 23 to the end point P2, a relation of x4>x3 is established. In other words, each slit is formed at a position nearer to the position where the connector is disposed than to an end portion of the substrate 20. As a result of this, regions where the influences of the radiation currents from the connectors 10 and 11 are small can be comparatively widely secured on both the left and right sides of the substrate 20.

Note that embodiments of the present invention are not limited to the above-described ones. For example, while the connectors to be used for communication based on the USB 3.0 standard and the HDMI standard have been taken as an object in the above description, the slit or slits may be provided for restraining the radiation currents generated from various connectors other than the described ones. In addition, the shape of the slit is not limited to the above-described shape, and various shapes may be adopted insofar as the electrical length of the slit corresponds to the wavelength of the radiation currents generated from the connector.

Besides, the characteristics possessed respectively by the plurality of embodiments described above may be combined with one another and applied to one electronic apparatus. For example, in the aforementioned third and fourth embodiments, part or the whole of the plurality of slits may be in a meandering shape. In addition, in the first to third embodiments, a plurality of connectors may be disposed side by side. Besides, in the fourth embodiment, only one connector may be provided.

REFERENCE SIGNS LIST

1*a*, 1*b*, 1*c*, 1*d* Electronic apparatus, 10, 11 Connector, 20 Substrate, 21, 22, 23 Slit.

The invention claimed is:

1. An electronic apparatus comprising:
a substrate for mounting circuit elements; and
a communication receptacle disposed on one edge constituting an outer periphery of the substrate, wherein a radiation current is generated on the substrate under the influence of the communication when another apparatus is connected to the electronic apparat us via the communication receptacle,
wherein a slit is formed in the substrate, with a starting point of the slit being a position between an end point on one side of the edge and a position where the communication receptacle is disposed,
wherein an electrical length of the slit is a length of one eighth to three eighths of a wavelength of a radiation current generated due to communication through the communication receptacle, and
wherein the slit has a meandering shape defining a winged U-shaped slit.

2. The electronic apparatus according to claim 1, wherein the starting point of the slit is located at a position nearer to the communication receptacle than to the end point of the edge.

3. The electronic apparatus according to claim 1, wherein the slit has a rectilinear shape.

4. The electronic apparatus according to claim 1, wherein an open side of the U of the winged U-shaped slit faces the communication receptacle.

5. The electronic apparatus according to claim 1, wherein a plurality of slits differing in length are formed in the substrate, with starting points of the slits being positions between the end point and the position where the communication receptacle is disposed, wherein a longer slit is between a shorter slit and the receptacle.

6. The electronic apparatus according to claim 1, wherein another slit is further formed in the substrate, with a starting point of the another slit being a position between an end point on a side opposite to the end point of the edge and the position where the communication receptacle is disposed.

7. The electronic apparatus according to claim 1, wherein the radiation current is propagated in the substrate, mainly along the outer periphery of the substrate.

8. An electronic apparatus comprising:
a substrate; and
a communication receptacle disposed on one edge constituting an outer periphery of the substrate, wherein a radiation current is generated on the substrate under the influence of the communication when another apparatus is connected to the electronic apparatus via the communication receptacle,
wherein a single rectilinear slit is formed in the substrate, proximate a midpoint of the edge, with a starting point of the slit being a position between an end point on one side of the edge and a position where the communication receptacle is disposed,
wherein an electrical length of the slit is a length of one eighth to three eighths of a wavelength of a radiation current generated due to communication through the communication receptacle, and
wherein the slit has a meandering shape defining a winged U-shaped slit.

* * * * *